United States Patent [19]

Gell et al.

[11] 4,116,723
[45] Sep. 26, 1978

[54] HEAT TREATED SUPERALLOY SINGLE CRYSTAL ARTICLE AND PROCESS

[75] Inventors: Maurice L. Gell; David N. Duhl, both of Newington, Conn.

[73] Assignee: United Technologies Corporation, Hartford, Conn.

[21] Appl. No.: 742,967

[22] Filed: Nov. 17, 1976

[51] Int. Cl.² .............................................. C22F 1/10
[52] U.S. Cl. ......................................... 148/3; 75/171; 148/32.5; 148/162
[58] Field of Search .................... 75/171, 170; 148/32, 148/32.5, 3, 162

[56] References Cited

U.S. PATENT DOCUMENTS 3,494,709  2/1970  Piearcey .............................. 75/171

Primary Examiner—R. Dean
Attorney, Agent, or Firm—Charles E. Sohl

[57] ABSTRACT

Nickel base superalloy single crystal articles formed from an alloy family and heat treated are described as is the process employed. The articles are substantially free from cobalt and the grain boundary strengtheners such as carbon, boron, and zirconium. The heat treatment process homogenizes the microstructure, and refines the gamma prime morphology.

7 Claims, 8 Drawing Figures

FIG. 1 (250 X)
FIG. 2 (250 X)
FIG. 3 (250 X)
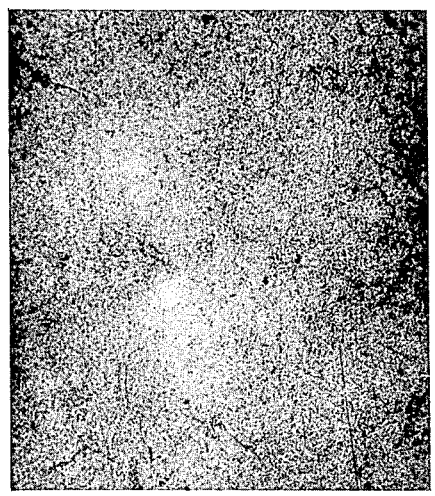

FIG. 7 (250 X)
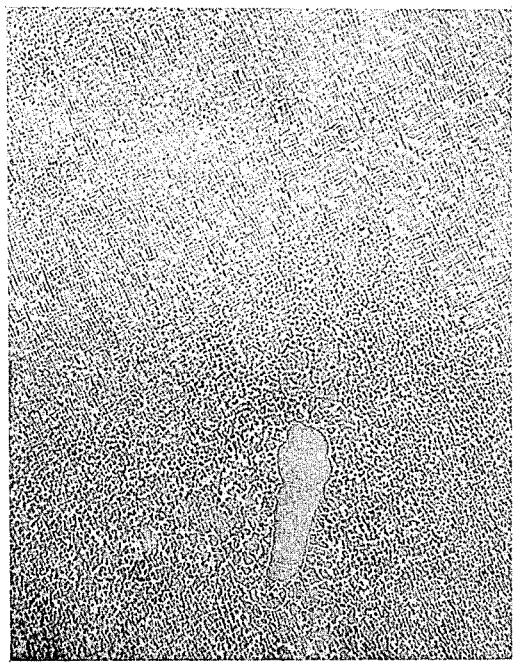
FIG. 8 (250 X)
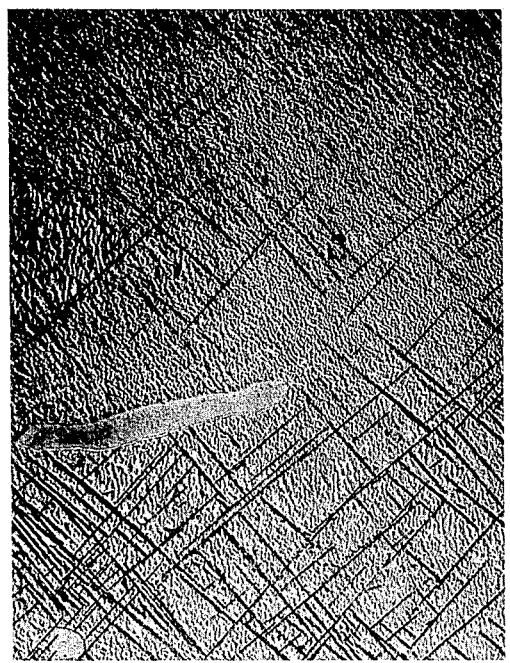

HEAT TREATED SUPERALLOY SINGLE CRYSTAL ARTICLE AND PROCESS

BACKGROUND OF THE INVENTION

1. Field of the Invention

This invention relates to the field of homogeneous single crystal superalloy articles.

2. Description of the Prior Art

The nickel base superalloy art area has been extensively investigated for many years, and as a result there are very many issued patents in this area. Some of these disclose alloys in which no intentional additions of cobalt, carbon, boron, or zirconium are made, or alloys in which these elements are optional. These include for example U.S. Pat. Nos. 2,621,122; 2,781,264; 2,912,323; 2,994,605; 3,046,108; 3,166,412; 3,188,204; 3,287,110; 3,304,176; and 3,322,534. These patents do not discuss single crystal applications.

U.S. Pat. No. 3,494,709, assigned to the assignee of the present invention, discloses the use of single crystal articles in gas turbine engines. This patent discusses the desirability of limiting certain elements such as boron and zirconium to low levels.

The limitation of carbon to low levels in single crystal superalloy articles is discussed in U.S. Pat. No. 3,567,526 which is also assigned to the present assignee.

U.S. Pat. No. 3,915,761, assigned to the present assignee discloses a nickel base superalloy article produced by a method which provides a hyperfine dendritic structure. As a result of the fineness of the structure, the article may be homogenized in relatively short times.

The conventional nickel base superalloys which are used to fabricate such parts have evolved over the last 30 years. Typically these alloys contain chromium to levels of about 10% primarily for oxidation resistance, aluminum and titanium in combined levels of about 5% for the formation of the strengthening gamma prime phase and refractory metals such as tungsten, molybdenum, tantalum and columbium in levels of about 5% as solid solution strengtheners. Virtually all nickel base superalloys also contain cobalt in levels of about 10%, and carbon in levels of about 0.1% which acts as a grain boundary strengthener and forms carbides which strengthen the alloy. Boron and zirconium are also often added in small amounts as grain boundary strengtheners.

Most commonly, gas turbine blades are formed by casting and the casting process most often utilized produces parts having equiaxed nonoriented grains. It is well known that the high temperature properties of metals are usually quite dependent upon grain boundary properties, consequently efforts have been made to strengthen such boundaries (for example by the additions discussed previously), or to reduce or eliminate the grain boundaries transverse to the major stress axis of the part. One method of eliminating such transverse boundaries is termed directional solidification and is described in U.S. Pat. No. 3,260,505. The effect of directional solidification is to produce an oriented microstructure of columnar grains whose major axis is parallel to the stress axis of the part and which has minimal or no grain boundaries perpendicular to the stress axis of the part. A further extension of this concept is the utilization of single crystal parts in gas turbine blades. This concept is described in U.S. Pat. No. 3,494,709. The obvious advantage of the single crystal blade is the complete absence of grain boundaries. In single crystals, therefore, grain boundaries are eliminated as potential weaknesses, hence, the mechanical properties of the single crystal are completely dependent upon the inherent mechanical properties of the material.

In the prior art alloy development much effort was devoted to the solution of problems resulting from grain boundaries, through the addition of elements such as carbon, boron, and zirconium. Another problem which prior art alloy development sought to avoid was the development of deleterious phases after long term exposures at elevated temperatures (i.e. alloy instability). These phases are of two general types. One, such as sigma, is undesirable because of its brittle nature while the other, such as mu, is undesirable because the phase ties up large amounts of the refractory solid solution strengtheners thus weakening the remaining alloy phases. These phases have been termed TCP phases for topologically close packed phases, and one of their common properties is that they all contain cobalt. There are of course TCP phases which can form in the absence of cobalt but these cobalt free TCP phases contain other elements such as silicon which are not commonly found in nickel base superalloys. While an obvious remedy to control these deleterious phases is the removal of cobalt, this has not proved practical in prior art alloys for polycrystalline applications. The problem is that if the cobalt is removed the carbon combines preferentially with the refractory metals to form $M_6C$ carbides which are deleterious to the properties of the material as their formation depletes the alloy of the strengthening refractory elements.

U.S. Pat. No. 3,567,526 teaches that carbon can be completely removed from single crystal superalloy articles and that such removal improves fatigue properties.

In single crystal articles which are free from carbon there are two important strengthening mechanisms. The most important strengthening mechanism is the intermetallic gamma prime phase, $Ni_3(Al, Ti)$. In modern nickel base superalloys the gamma prime phase may occur in quantities as great as 60 volume percent. The second strengthening mechanism is the solid solution strengthening which is produced by the presence of the refractory metals such as tungsten and molybdenum in the nickel solid solution matrix. For a constant volume fraction of gamma prime, considerable variations in the strengthening effect of this volume fraction of gamma prime may be obtained by varying the size and morphology of the gamma prime precipitate particles. The gamma prime phase is characterized by having a solvus temperature above which the phase dissolves into the matrix. In many cast alloys, however, the gamma prime solvus temperature is in fact above the incipient melting temperature so that it is not possible to effectively solutionize the gamma prime phase. Solutionizing of the gamma prime is the only practical way in which the morphology of the gamma prime can be modified, hence for many commercial nickel base superalloys the gamma prime morphology is limited to the morphology which resulted from the original casting process. The other strengthening mechanism, solid solution strengthening, is most effective when the solid solution strengthening elements are uniformly distributed throughout the nickel solid solution matrix. Again this strengthening is reduced in effectiveness because of the nature of the casting process. Practical nickel base superalloys freeze over a wide temperature range. The freezing or solidification process involves the formation of high melting point dendrites followed by the subsequent freezing of the lower temperature melting interdendritic fluid. This solidification process leads to significant compositional inhomogenities throughout the microstructure. It is theoretically possible to homogenize such a microstructure by heating at elevated temperatures to permit diffusion to occur, however, in practical nickel base superalloys the maximum homogenization temperature, which is limited by the incipient melting temperature, is too low to permit significant homogenization in practical time intervals.

SUMMARY OF THE INVENTION

This invention includes three interrelated aspects. The first aspect is the particular alloy employed. In its broadest form the alloy is a nickel base alloy containing from about 5 to about 18% chromium, at least 5% of an element chosen from the group consisting of from 2 to 8% aluminum and from 1 to 5% titanium and mixtures thereof, at least 5% of an element chosen from the group consisting of up to 10% molybdenum, up to 15% tungsten, up to 12% tantalum, up to 7% rhenium, up to 3.5% hafnium, and up to 3% columbium, and mixtures thereof, balance essentially nickel. The alloy employed in the present invention is free from intentional additions of cobalt, carbon, boron and zirconium, although obviously these elements may be present in impurity levels. The alloy is characterized by having an incipient melting temperature in excess of about 2300° F. and by having a gamma prime solvus temperature which is significantly below this incipient melting temperature but at the same time is higher than the gamma prime solvus temperatures for typical commercial nickel base superalloys. Thus this alloy may be heat treated under conditions which permit complete solutionizing of the gamma prime phase without incipient melting. At the same time the high incipient melting temperature permits essentially complete homogenization of the alloy in commercially practicable times. The high incipient melting temperature of the alloy is a result of the absence of carbon, boron and zirconium. The absence of cobalt inhibits the formation of deleterious TCP phases.

The second important aspect of the invention is the formation of the previously described alloy into single crystal articles.

The third aspect of the invention is the heat treatment sequence by which the gamma prime morphology may be modified and refined at the same time that significant homogenization of the as cast microstructure is performed. The resultant single crystal article will have a microstructure whose typical gamma prime particle size is about 1/5 of the gamma prime particle size found in the as cast material. At the same time the heat treated single crystal microstructure will be essentially free from compositional inhomogenities and this uniform microstructure combined with the increased gamma prime solvus temperature will permit the article of the present invention to exhibit temperature capabilities, for equal mechanical properties, which are at least 30° F. greater than the temperature capabilities of comparable prior art single crystal articles which are formed from conventional alloys containing cobalt, carbon, boron and zirconium.

The foregoing, and other objects, features and advantages of the present invention will become more apparent in the light of the following detailed description of the preferred embodiment thereof as shown in the accompanying drawing.

BRIEF DESCRIPTION OF THE DRAWING

FIG. 1 shows the as cast microstructure of the invention alloy;

FIG. 2 shows the microstructure of the invention alloy after a 4 hour exposure at 2200° F.;

FIG. 3 shows the microstructure of the invention alloy after a 4 hour exposure at 2350° F.;

FIG. 7 shows the microstructure of the invention alloy after 500 hours at 1800° F.; and FIG. 8 shows the microstructure of a prior art alloy after 500 hours at 1800° F.

DESCRIPTION OF THE PREFERRED EMBODIMENT

Figure 4:
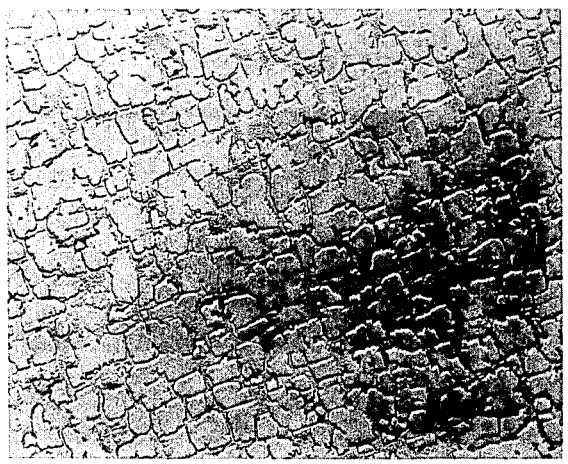
FIG. 4 is an electron micrograph showing the as cast gamma prime morphology of the invention alloy.

In the description which follows, all percent figures are in weight percent unless otherwise specified.

This invention relates to an article made of a specific alloy by a critical series of process steps. Although other articles may be produced according to this invention, this invention has particular utility in the fabrication of airfoils (blades and vanes) for use in gas turbine engines.

A primary feature in the alloys employed in the present invention is the substantial elimination of both cobalt and the grain boundary strengthening agents, carbon, boron and zirconium. The alloys of the invention are intended for use as gas turbine components in single crystal form. No intentional additions of these elements, cobalt, carbon, boron and zirconium are made, however, some will invariably be present as an impurity.

In order to ensure that TCP phases will not form in the alloy over a wide range of compositions and operating conditions, the level of cobalt, as an impurity, is restricted to less than about 0.5% and more preferably is restricted to less than about 0.2%.

Likewise, with regard to the grain boundary strengthening agents carbon, boron and zirconium, no intentional additions are made. If the maximum benefit is to be obtained from this invention, no single element of the group carbon, boron and zirconium should be present in an amount greater than 50 ppm and it is preferred that the total of such impurities be less than 100 ppm. Most preferably carbon is present in an amount less than 30 ppm and the remaining elements are each present in quantities less than 20 ppm. In any event, the carbon level must be restricted to be below that amount of carbon which will form MC type carbides. It must be emphasized that no intentional addition of these elements is contemplated and that their presence in the alloy or single crystal article of the invention is unintentional and undesirable.

Alloys which can be produced using the concept of the present invention will contain:

(1) from 5 to 18% chromium,
(2) at least 5% of an element chosen from the group consisting of from 2 to 8% aluminum and from 1 to 5% titanium and mixtures thereof, (3) at least 5% of an element chosen from the group consisting of up to 10% molybdenum, up to 15% tungsten, up to 12% tantalum, up to 3% columbium, up to 3.5% hafnium, up to 7% rhenium, and mixtures thereof, and (4) balance essentially nickel.

Hafnium has been used in prior art alloys as a grain boundary strengthener. In the absence of grain boundaries (i.e. single crystals), hafnium can perform other functions, for example it has been observed to substitute for Al in gamma prime. In addition, it does not have the extreme effects on incipient melting points that the other grain boundary strengthening agents, such as carbon, and boron have. For these reasons, hafnium need not be excluded from the alloy.

Alloys selected within the above ranges will have incipient melting temperatures which exceed 2300° F. and gamma prime solvus temperatures which are at least 35° F. below the incipient melting temperature.

Alloys made according to the preceding limitation will comprise a nickel chromium solid solution containing at least 30% by volume of an ordered phase of the composition $Ni_3M$ where M is aluminim, titanium, columbium, tantalum, tungsten, hafnium or mixtures thereof.

The alloys within the ranges set forth above are thermally stable since microstructural instabilities such as the cobalt containing TCP phases will not form, even after extended exposure at elevated temperature as for example 500 hours at 1800° F. Further the alloys have good fatigue properties since the formation of deleterious carbide particles is prevented. The refractory metals which would normally combine with carbon or precipitate in TCP phase formation remain in solid solution and result in an alloy having exceptional mechanical properties.

An important benefit which arises from the elimination of boron, carbon and zirconium is an increase in the incipient melting temperature. Typically the incipient melting temperature of the present alloys, that temperature at which the alloy first begins localized melting, will be increased by at least 50° F. over the incipient melting temperature of a similar (prior art) alloy which contains normal amounts of carbon, boron and zirconium. The incipient melting temperature of the alloy of this invention will typically exceed 2300° F. while conventional high strength, high volume fraction $\gamma'$ alloys have incipient melting temperatures below about 2300° F. This increased temperature permits solutionizing heat treatments to be performed at temperatures where complete solutionizing of the gamma prime is possible while simultaneously permitting a significant amount of homogenization within reasonable times.

The alloy of the present invention will not form the carbides which have been found necessary for grain boundary strengthening in polycrystalline nickel base superalloys. For this reason the alloys of the present invention must be used as single crystal articles. The formation of the alloy into single crystal form is a critical aspect of the present invention, but the method of single crystal formation is unimportant. Typical articles and solidification techniques are described in U.S. Pat. No. 3,494,709 to Piearcey, which is assigned to the assignee of the present application, and the contents of this patent are incorporated herein by reference.

The final aspect of the invention involves the specific heat treatment applied to the single crystal article. The as cast single crystal article will contain the gamma prime phase in dispersed form with a typical particle size of 1.5 microns. The gamma prime solvus of the alloy will typically fall in the range of 2250°-2450° F. and the incipient melting temperature will be in excess of about 2300° F. Thus heat treatment in the range of 2285°-2500° F. will place the gamma prime phase into solution without deleterious localized melting. Times on the order of ½ to 8 hours will normally be satisfactory although longer times may be employed. Such heat treatment temperatures are about 100° F. higher than those which can be employed with polycrystalline articles of conventional superalloys. This elevated temperature permits a substantial amount of homogenization to occur during the solutionizing steps.

FIG. 1 shows the microstructure of the alloy of the invention in the as cast condition. FIG. 2 shows the microstructure after a 4 hour heat treatment at 2200° F. (typical of treatments used with conventional superalloys) showing that little homogenization has occurred. FIG. 3 shows the microstructure of another sample of the same alloy after a 4 hour treatment at 2350° F. A high degree of homogenization is readily apparent.

Following the solutionizing treatment, an aging treatment at 1600°-2000° F. may be utilized to reprecipitate the gamma prime in refined form. Typical gamma prime particle sizes after reprecipitation will be less than about 0.5 microns.

Figure 5:
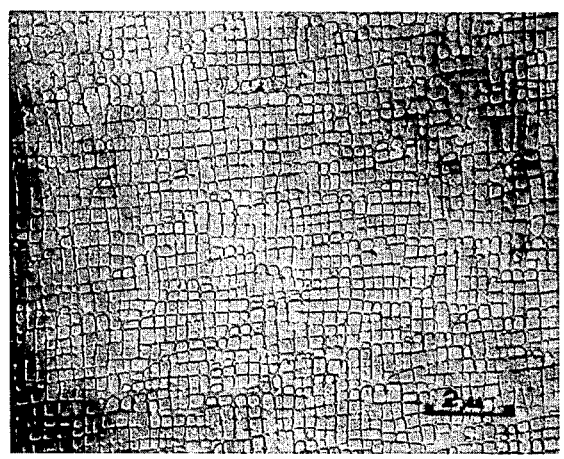
FIG. 5 is an electron micrograph showing the gamma prime morphology of the invention alloy after heat treatment at 2350° F. for 4 hours and 1975° F. for 4 hours and 1600° F. for 32 hours.

FIG. 4 shows an electron micrograph showing the gamma prime particle morphology in the as cast single crystal alloy of the present invention. FIG. 5 shows the gamma prime morphology after the heat treatment discussed above (4 hours at 2350° F. followed by 4 hours at 1975° F. and 32 hours at 1600° F.). The refinement of the gamma prime is obvious.

The preceding discussion of the preferred embodiment will be clarified through reference to the following illustrative examples:

EXAMPLE 1

Two alloys were prepared for comparative tests. The alloys had compositions as follows:

TABLE I

| | Alloy 444 | PWA 1409 (nominal |
|---|---|---|
| Carbon | 50 ppm max | 0.15 |
| Tungsten | 11.5 – 12.5 | 12.5 |
| Titanium | 1.75 – 2.25 | 2.0 |
| Columbium | .75 – 1.25 | 1.0 |
| Zirconium | 20 ppm max | .05 |
| Cobalt | .1 max | 10.0 |
| Chromium | 8.0 – 10.0 | 9.0 |
| Aluminum | 4.75 – 5.25 | 5.0 |
| Boron | 20 ppm max | 0.015 |
| Nickel | balance | balance |

The alloy identified as Alloy 444 had a composition falling within the ranges disclosed in the present application while the alloy denoted as PWA 1409 had a similar composition except for the presence of cobalt, boron, carbon and zirconium. These alloys were fashioned into single crystals having similar crystallographic orientations.

EXAMPLE 2

The alloys prepared as Example 1 were tested at elevated temperatures. The test conditions and test results are listed below in Table II.

TABLE II

| Alloy | Temp. (° F) | Stress (ksi) | Time to 1% Creep (hrs.) | Life (hrs.) |
| --- | --- | --- | --- | --- |
| PWA 1409 | 1400 | 110 | 12 | 447 |
| Alloy 444 | 1400 | 110 | 144 | 567 |
| 1409 | 1600 | 65 | 54 | 204 |
| 444 | 1600 | 65 | 54 | 237 |
| 1409 | 1800 | 30 | 69 | 164 |
| 444 | 1800 | 30 | 219 | 428 |

These results clearly demonstrate the superior mechanical properties as compared to a similar prior art nickel base superalloy containing cobalt, carbon, boron and zirconium. Both the time to 1% creep and the time to rupture are increased, except at 1600° F. where the time to 1% creep is unaffected. The alloy of the present invention is particularly superior at 1800° F. which is significant in view of the increased operating temperatures used in current gas turbine engines.

EXAMPLE 3

Alloys having nominal compositions as set forth in Table III were prepared in single crystal form (except for alloys A and B which were prepared in directionally solidified columnar grain form according to current commercial practice). These alloys differed only in the amounts of cobalt, boron, zirconium, hafnium and carbon which were present. Thus alloy D (the invention) may be completely solutionized since the incipient melting temperature is safely above the gamma prime solvus temperature. The permitted homogenization temperature for alloy D is 175° greater than that usable with the commercial alloy.

The incipient melting temperature was determined to be: alloy A, 2200° F.; alloy B, 2265° F.; alloy C, 2325° F.; and alloy D, 2375° F. Thus alloy D (the invention) may be completely solutionized since the incipient melting temperature is safely above the gamma prime solvus temperature. The permitted homogenization temperature for alloy D is 175° F. greater than that usable with the commercial alloy.

Figure 6:
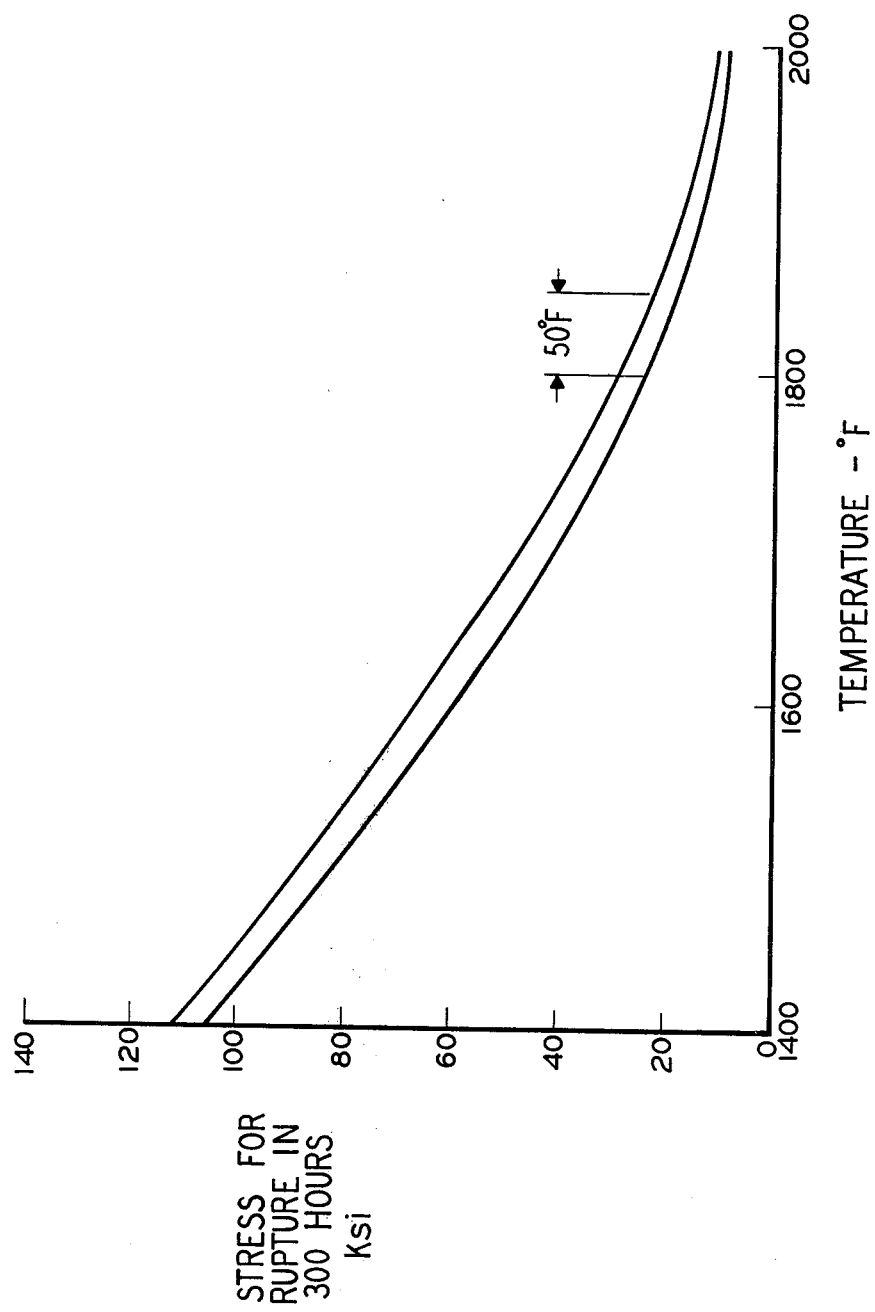
FIG. 6 shows a comparison of the creep strength of the article of the invention with the prior art.

FIG. 6 shows a plot of the stress rupture properties of alloys A and D. Calculation from this figure shows that the alloy of the invention displays a temperature advantage of about 50° F. for equivalent conditions or stress and time at 1800° F. over alloy A.

TABLE III

| | A | B | C | D |
| --- | --- | --- | --- | --- |
| Carbon | .15 | .15 | ≃20 ppm | ≃10 ppm |
| Boron | .015 | .015 | .015 | ≃5 ppm |
| Zirconium | .1 | .1 | .1 | ≃5 ppm |
| Hafnium | 2.0 | <50 ppm | <50 ppm | <50 ppm |
| Cobalt | 10.0 | 10.0 | 10.0 | <.1 |
| Chromium | 9.0 | 9.0 | 9.0 | 9.0 |
| Tungsten | 12.0 | 12.0 | 12.0 | 12.0 |
| Columbium | 1.0 | 1.0 | 1.0 | 1.0 |
| Titanium | 2.0 | 2.0 | 2.0 | 2.0 |
| Aluminum | 5.0 | 5.0 | 5.0 | 5.0 |
| Nickel | Bal | Bal | Bal | Bal |
| γ' solvus | 2250° | 2250° | 2250° | 2335° |
| Incipient melting point | 2200° | 2265° | 2325° | 2375° |

EXAMPLE 4

Samples of the alloys of Example 3 were exposed at 1800° F. for 500 hours and examined.

FIG. 7 shows the microstructure of Alloy 444 (alloy D, the invention) at a magnification of 250X, and FIG. 8 shows the microstructure of alloy C at a magnification of 500X. FIGS. 7 and 8 show the metallographic structures after this long term, high temperature exposure. An acicular TCP μ phase is clearly visible in the cobalt containing alloy in FIG. 8.

Although the invention has been shown and described with respect to a preferred embodiment thereof, it should be understood by those skilled in the art that various changes and omissions in the form and detail thereof may be made therein without departing from the spirit and scope of the invention.

Having thus described a typical embodiment of our invention, that which we claim as new and desire to secure by Letters Patent of the United States is:

1. A single crystal nickel base superalloy article free from intentional additions of cobalt, carbon, boron, and zirconium, consisting essentially of from about 5 to about 18% chromium, at least 5% of an element chosen from the group consisting of from 2 to 8% aluminum and from 1 to 5% titanium and mixtures thereof; at least 5% of an element chosen from the group consisting of up to 10% molybdenum, up to 15% tungsten, up to 12% tantalum, up to 3% columbium, up to 3.5% hafnium, up to 7% rhenium, and mixtures thereof; balance essentially nickel; said single crystal article having a homogeneous microstructure which contains gamma prime particles having a size of less than 0.5 microns, and said microstructure being free of MC type carbides, and TCP phases.

2. An article as in claim 1 in which the impurity levels of carbon, boron and zirconium do not individually exceed 50 ppm.

3. An article as in claim 1 in which the impurity levels of carbon, boron and zirconium do not collectively exceed 100 ppm.

4. An article as in claim 1 in which the impurity level of cobalt does not exceed 0.5%.

5. An article as in claim 1 in which the impurity level of cobalt does not exceed 0.2%.

6. An article as in claim 1 which contains from 8 to 10% chromium, from 11.5 to 12.5% tungsten, from 1.75 to 2.25% titanium, from 4.75 to 5.25% aluminum, from 0.75 to 1.25% columbium; and as impurities; not more than 0.1% cobalt, not more than 50 ppm carbon, not more than 20 ppm boron, and not more than 20 ppm zirconium.

7. A method for producing nickel base superalloy single crystal articles which have a homogeneous microstructure and in which the gamma prime phase presents a refined morphology, including the steps of:
   a. providing a mass of nickel base superalloy material which is free from intentional additions of a cobalt, carbon, boron, and zirconium; and which consists essentially of from about 5 to 18% chromium; at least 5% of an element chosen from the group consisting of from 2 to 8% aluminum and from 1 to 5% titanium and mixture thereof; at least 5% of an element chosen from the group consisting of up to 10% molybdenum, up to 15% tungsten, up to 12% tantalum, up to 3% columbium, up to 3.5% hafnium, up to 7% rhenium, and mixtures thereof; balance essentially nickel,
   b. melting the nickel base superalloy and solidifying the alloy under conditions of unidirectional heat flow so as to produce a single crystal article having a microstructure which consists essentially of gamma prime particles in a gamma prime matrix, with the gamma prime particles having a particle size of about 1.5 microns, said article having an incipient melting temperature, in excess of about 2300° F., as a result of the absence of carbon, boron and zirconium, and a gamma prime solvus temperature, which is less than the incipient melting temperature, said microstructure being free of MC type carbides as a result of the absence of carbon and free from TCP phases, as a result of the absence of cobalt, c. heating the article to a temperature greater than the gamma prime solvus temperature and less than the incipient melting temperature for a period of time sufficient to dissolve substantially all of the gamma prime phase into solid solution while simultaneously homogenizing the microstructure, d. heating the article at a temperature below the gamma prime solvus for a period of time sufficient to reprecipitate the gamma prime phase in refined form, whereby the reprecipitated gamma prime phase has a particle size of less than about 0.5 microns and the heat treated single crystal article has a temperature advantage of at least 30° F. over non-heat treated articles.

* * * * *